United States Patent
Chang et al.

(10) Patent No.: US 7,056,832 B2
(45) Date of Patent: Jun. 6, 2006

(54) DEEP TRENCH SELF-ALIGNMENT PROCESS FOR AN ACTIVE AREA OF A PARTIAL VERTICAL CELL

(75) Inventors: Ming-Cheng Chang, Taoyuan (TW); Yi-Nan Chen, Taipei (TW); Tse-Yao Huang, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 187 days.

(21) Appl. No.: 10/622,965

(22) Filed: Jul. 18, 2003

(65) Prior Publication Data
US 2004/0219798 A1 Nov. 4, 2004

(30) Foreign Application Priority Data
May 2, 2003 (TW) .............................. 92112102 A (51) Int. Cl.
*H01L 21/302* (2006.01)
(52) U.S. Cl. ...................... 438/725; 438/243; 438/697; 438/700; 438/714; 438/717; 438/719; 438/734
(58) Field of Classification Search ................ 438/243, 438/697, 700, 714, 717, 719, 725, 734
See application file for complete search history.

(56) References Cited

U.S. PATENT DOCUMENTS

| 6,034,389 | A | 3/2000 | Burns, Jr. et al. | |
|---|---|---|---|---|
| 6,204,140 | B1 * | 3/2001 | Gruening et al. | 438/386 |
| 6,534,359 | B1 * | 3/2003 | Heo et al. | 438/243 |
| 6,551,874 | B1 * | 4/2003 | Pohl et al. | 438/243 |
| 6,576,945 | B1 * | 6/2003 | Mandelman et al. | 257/301 |
| 6,809,368 | B1 * | 10/2004 | Divakaruni et al. | 257/302 |
| 6,909,136 | B1 * | 6/2005 | Chen et al. | 257/301 |
| 6,929,996 | B1 * | 8/2005 | Hao et al. | 438/238 |
| 6,969,881 | B1 * | 11/2005 | Chang et al. | 257/302 |
| 2005/0090064 | A1 * | 4/2005 | Chang et al. | 438/268 |

* cited by examiner

*Primary Examiner*—George A. Goudreau
(74) *Attorney, Agent, or Firm*—Quintero Law Office (57) ABSTRACT

A deep trench self-alignment process for an active area of a partial vertical cell. A semiconductor substrate with two deep trenches is provided. A deep trench capacitor is formed in each deep trench, and an isolating layer is formed thereon. Each trench is filled with a mask layer. A photoresist layer is formed on the semiconductor substrate between the deep trenches, and the photoresist layer partially covers the mask layer. The semiconductor substrate is etched lower than the isolating layer using the photoresist layer and the mask layer as masks. The photoresist layer and the mask layer are removed, such that the pillar semiconductor substrate between the deep trenches functions as an active area.

20 Claims, 7 Drawing Sheets

DEEP TRENCH SELF-ALIGNMENT PROCESS FOR AN ACTIVE AREA OF A PARTIAL VERTICAL CELL

BACKGROUND OF THE INVENTION

1. Field of the Invention

The invention relates to a deep trench self-alignment process, and more particularly to a deep trench self-alignment process for an active area of a partial vertical cell and a method for fabricating the same.

2. Description of the Related Art

There is much interest in reducing the size of individual semiconductor devices to increase their density on an integrated circuit (IC) chip. This reduces size and power consumption of the chip, and allows faster operation of the chip. In order to achieve a memory cell with a minimum size, the gate length in a conventional transistor must be reduced to decrease the lateral dimension of the memory cell. However, the shorter gate length results in higher leakage current that cannot be tolerated, and the voltage on the bit line must therefore also be scaled down. This reduces the charges stored on a storage capacitor, thus requiring a larger capacitance to ensure that stored charges are accurately detected.

In order to solve the above-mentioned problems, a stacked capacitor and a deep trench capacitor have been developed for a high-integration memory cell, such as dynamic random access memory (DRAM) cell. Specifically, the deep trench capacitor is formed in a deep trench within the silicon substrate, such that the capacitor storage region does not take up any additional wafer area. In addition, a vertical transistor has recently been developed which can maintain gate length of a suitable value to reduce leakage without decreasing the bit line voltage or increasing the memory cell's lateral dimensions.

A type of vertical transistor with a deep trench capacitor is disclosed in U.S. Pat. No. 6,034,389.

FIGS. 1a to 1e are cross-sections of the conventional method for fabricating a floating gate of a split gate flash memory.

Figure 1A:
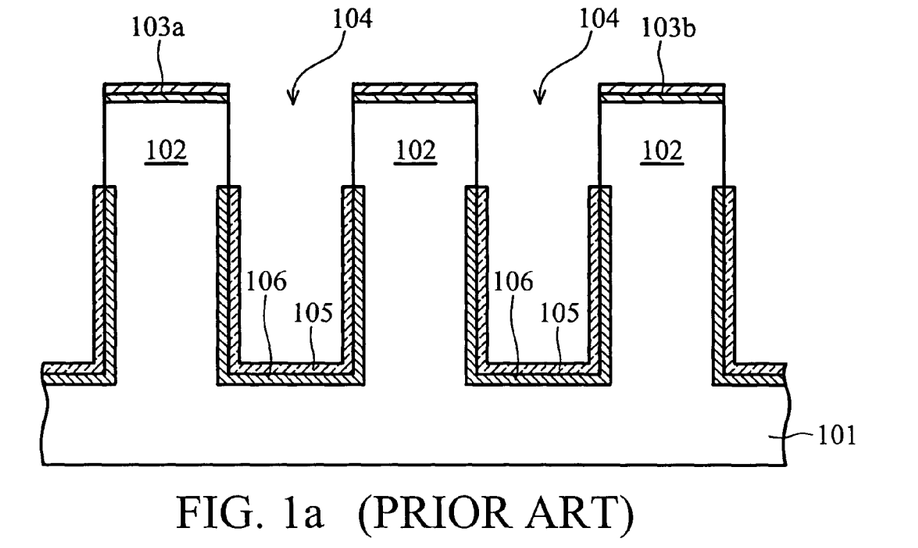
FIGS. 1a to 1e are cross-sections of the conventional method for fabricating a floating gate of a split gate flash memory.

In FIG. 1a, a P-type silicon substrate 101 comprises a plurality of deep trenches 104 and a plurality of pillars 102 corresponding to the deep trenches 104.

A thin pad oxide layer 103a and an oxynitride layer 103b are sequentially formed on the surface of the pillar 102. A doped oxide layer 105, such as ASG, acting as a source region diffusion source is formed on a bottom sidewall of the deep trench 104. The doped oxide layer 105 is annealed at a high temperature and a short time to diffuse As ions into the sidewall of the pillar 102 to form an n+ type diffusion region acting as an n+ type source region 106.

Figure 1B:
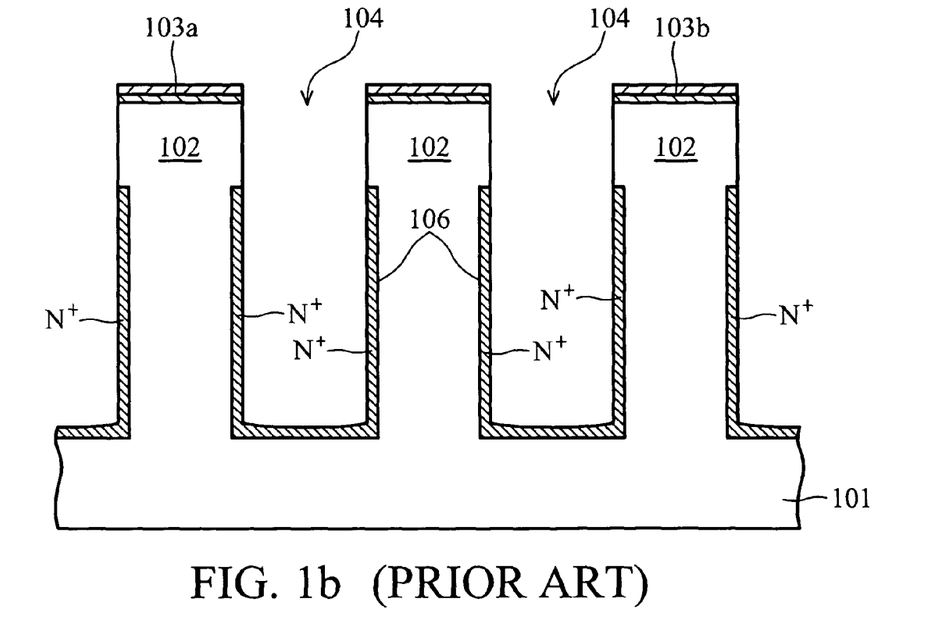

In FIG. 1b, the doped oxide layer 105 is removed.

Figure 1C:
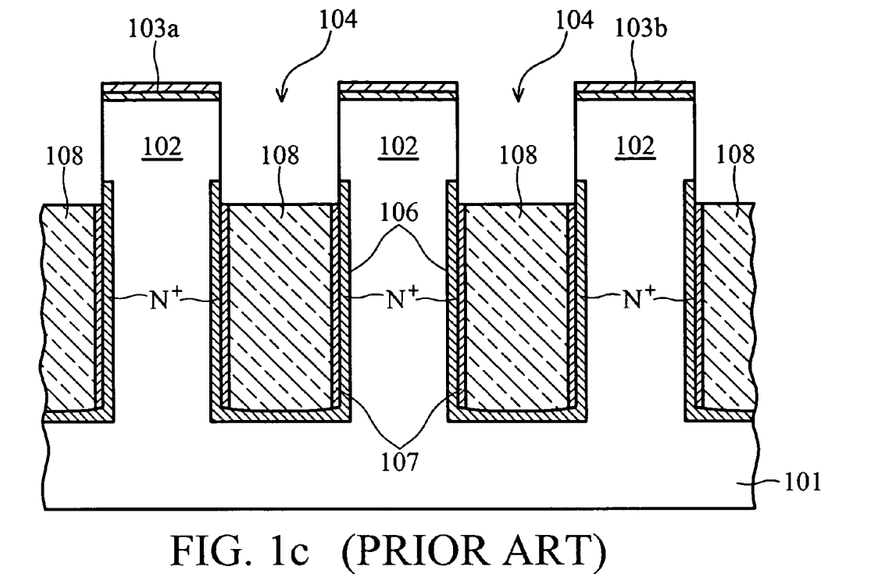

In FIG. 1c, an ONO thin film 107 is formed on the sidewall of the deep trench 104 acting as a dielectric material of the deep trench capacitor. An n+ type poly layer 108 is formed in the deep trench 104 acting as a capacitor plate. The ONO thin film 107 and the capacitor plate 108 are etched to a predetermined depth.

Figure 1D:
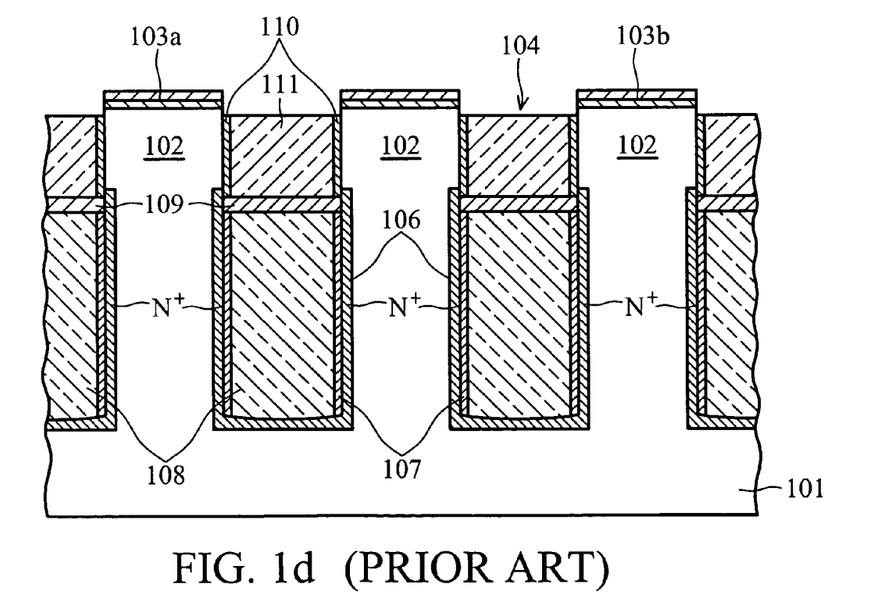

In FIG. 1d, a shelter 109 is formed on the n+ poly layer 108 acting as a gate insulator. A gate oxide layer 110 is formed on the sidewall of the deep trench 104, and the deep trench 104 is filled with an n+ poly layer 111 acting as a control gate.

Figure 1E:
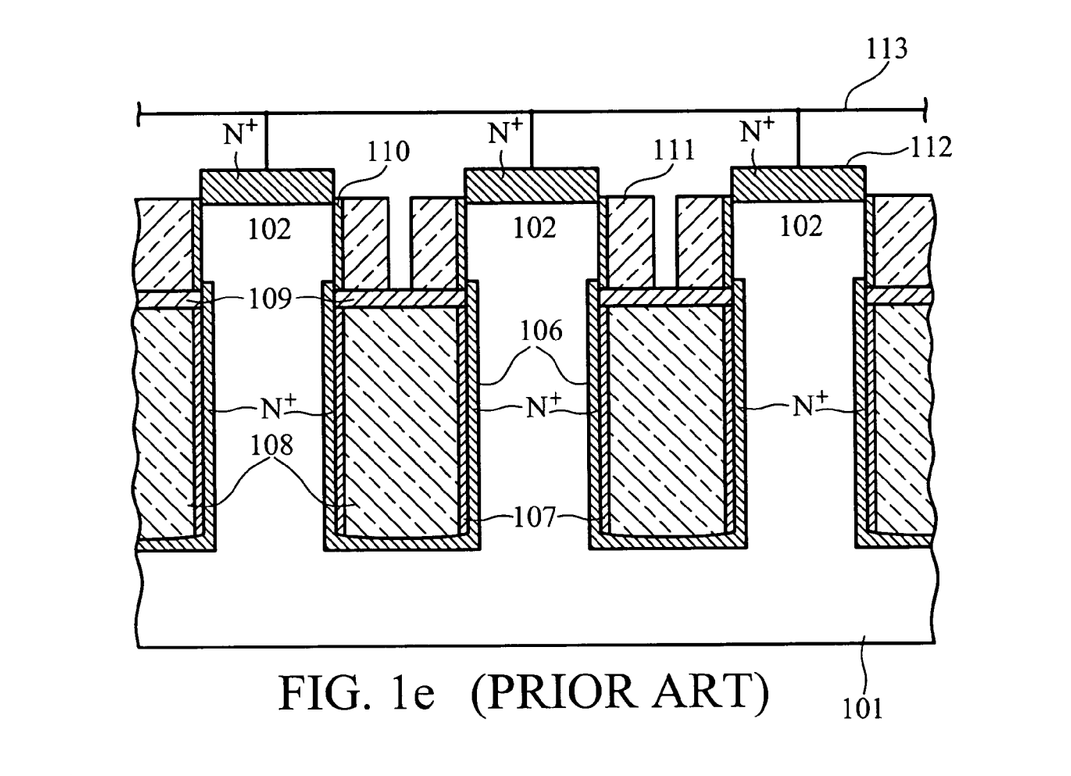

In FIG. 1e, the control gate 111 is separated into word lines by etching. The thin pad oxide layer 103a and oxynitride layer 103b are removed. An n+ drain 112 is formed in the top of the pillar 102. A metal layer is formed acting as a bit line layer 113. Thus, a memory unit array is completed.

According the above-described memory cell, the n+-type polysilicon layers 111, the $n^+$-type source region 106 and the $n^+$-type drain region 112 form the vertical transistor, and the $n^+$-type source region 106, the ONO thin film 107 and the $n^+$-type polysilicon layers 108 form the deep trench capacitor. In an open bit line case as described, the storage node of the deep trench capacitor is common to all the memory cells in the array, and the charge is stored on the $n^+$-type source region 106 within each pillar 102.

Although a channel occurs in the pillar 102 between n+ source region 106 and n+ drain region 112, the width of the pillar 102 cannot be reduced to avoid the depletion regions overlapping adjoining source regions 106 on the sidewall of the pillar 102.

The dopant in the capacitor easily diffuses to the active area when the active area in the pillar 102 is misaligned with the deep trench 104. The electrical properties of the memory cell are affected by the dopant concentration of the active area.

SUMMARY OF THE INVENTION

The present invention is directed to a deep trench self-alignment process for an active area of a partial vertical cell by filling an ARC layer in the deep trench.

Accordingly, the present invention provides a deep trench self-alignment process for an active area of a partial vertical cell. A semiconductor substrate with two deep trenches is provided. A deep trench capacitor is formed in each deep trench, and an isolating layer is formed thereon. Each trench is filled with a mask layer. A photoresist layer is formed on the semiconductor substrate between the deep trenches, and the photoresist layer partially covers the mask layer surface. The semiconductor substrate is etched lower than the isolating layer using the photoresist layer and the mask layer as masks. The photoresist layer and the mask layer are removed, such that the pillar semiconductor substrate between the deep trenches functions as an active area.

Accordingly, the present invention provides another deep trench self-alignment process for an active area of a partial vertical cell. A semiconductor substrate with a pad layer is provided. Two deep trenches are formed in the semiconductor substrate separated by a predetermined distance. A deep trench capacitor is formed in each deep trench, below the semiconductor substrate, and a ring-shaped insulating layer is formed on a top sidewall of each deep trench. An isolating layer is conformally formed on the semiconductor substrate and the deep trenches. The isolating layer on the sidewall of the deep trench is removed to leave the isolating layer on the surface of the deep trench capacitor. A mask layer is formed on the semiconductor substrate, and the deep trench is filled with the mask layer. The mask layer is planarized until the semiconductor substrate is exposed to leave the mask layer in the deep trenches. A photoresist layer is formed on the semiconductor substrate between the deep trenches. The photoresist layer partially covers the hard mask layer surface. The semiconductor substrate is etched to below the isolating layer by a predetermined depth using the photoresist layer and the mask layer as etching masks. The photoresist layer and the mask layer are removed, such that the pillared semiconductor substrate acts as an active area between the deep trenches.

BRIEF DESCRIPTION OF THE DRAWINGS

For a better understanding of the present invention, reference is made to a detailed description to be read in conjunction with the accompanying drawings, in which.

DETAILED DESCRIPTION OF THE INVENTION

FIGS. 2a to 2h are cross-sections of the deep trench self-alignment process for an active area of a partial vertical cell of the present invention.

Figure 2A:
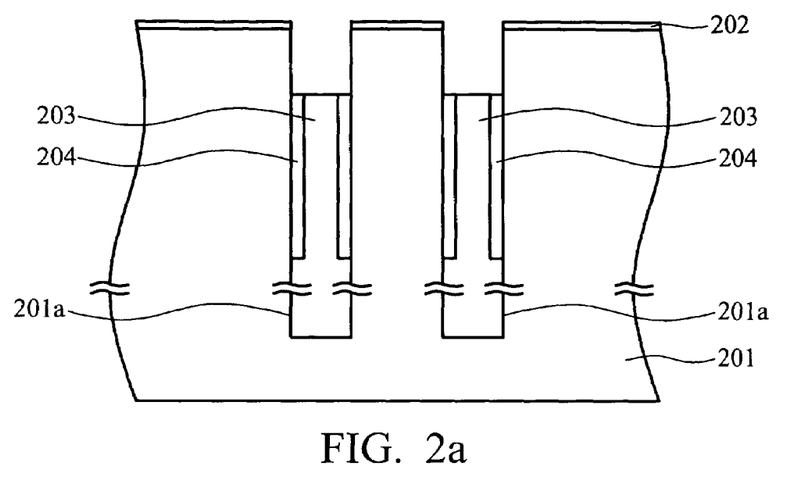
FIGS. 2a to 2h are cross-sections of the deep trench self-alignment process for an active area of a partial vertical cell of the present invention.

In FIG. 2a, a semiconductor substrate 201, such as silicon, with a pad layer 202, such as a pad oxide layer or a pad nitride layer, is provided. Two deep trenches 201a are formed in the semiconductor substrate 201 separated by a predetermined distance acting as an active area defined in subsequent process. The predetermined distance is about 1200 to 1400 Å.

Each deep trench 201a is filled with a conducting layer, such as poly layer, acting as a deep trench capacitor 203. The deep trench capacitor 203 is lower than the top surface of the semiconductor substrate 201 by a predetermined depth. A channel length of a subscript vertical MOS is defined by the predetermined depth. A ring-shaped insulating layer 204, such as collar oxide layer, is formed on a top sidewall of each deep trench 201a as gate isolation.

Figure 2B:
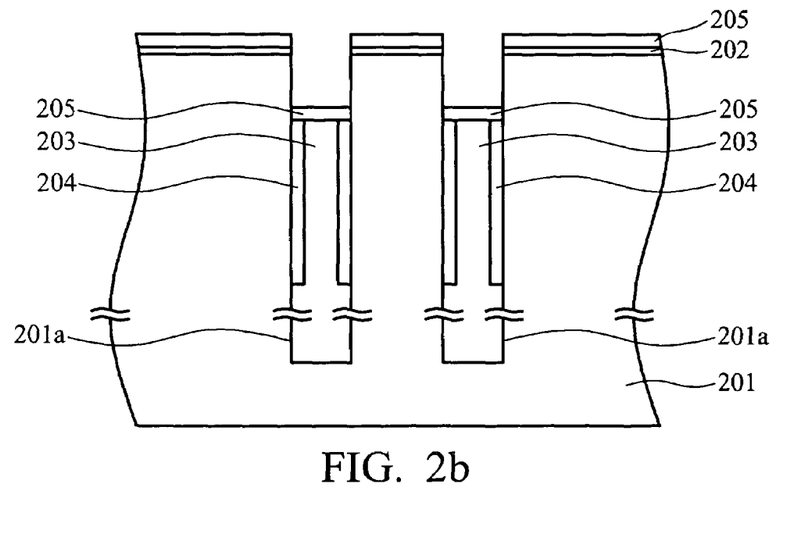

In FIG. 2b, an isolating layer is conformally formed on the semiconductor substrate 201, the deep trenches 201a, and deep trench capacitors 203. The isolating layer is anisotropically etched to remove the isolating layer from the sidewall of the deep trenches 201a, and an isolating layer 205, such as top trench oxide (TTO) layer, remains on the deep trench capacitors 203. The ratio of the isolating layer on the deep trench 201a sidewall to the isolating layer on the capacitor 203 surface is less than 1:8. The thickness of the isolating layer on the capacitor 203 surface is not significantly affected by etching of the isolating layer from the deep trench sidewall.

Figure 2C:
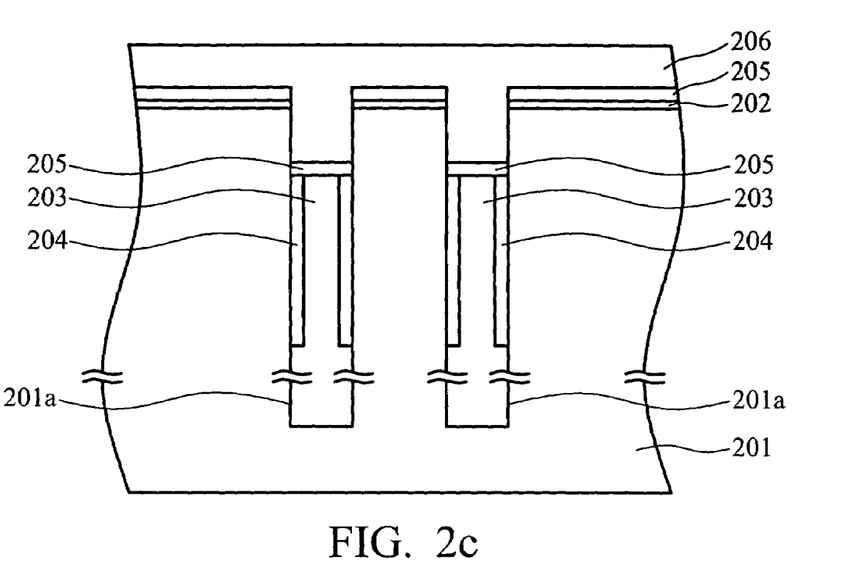
Figure 2D:
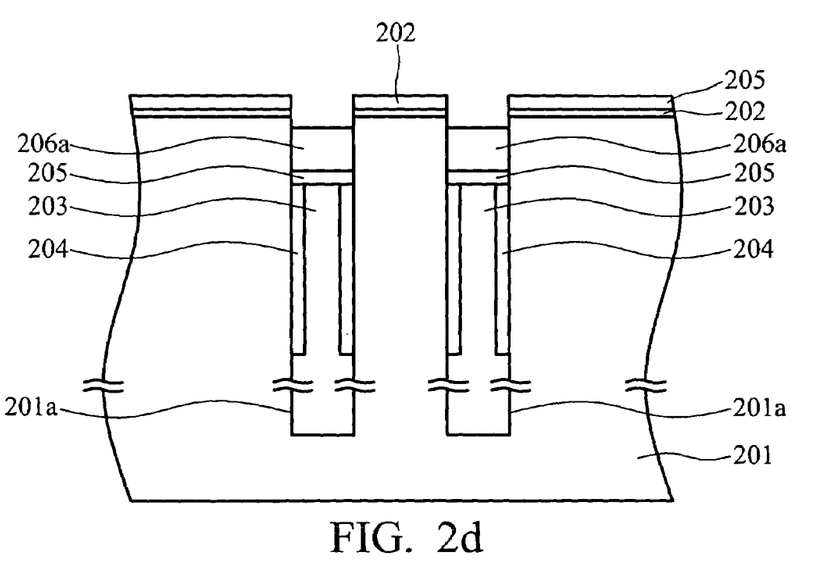

In FIG. 2c, a mask layer 206, such as organic anti-reflection coating layer, is formed on the pad layer 202, and the deep trenches 201a are filled with the mask layer 206. The organic anti-reflection coating layer is a SiON layer. In FIG. 2d, the mask layer 206 is planarized by CMP or etching to expose the pad layer 202 and leave the mask layer 206a in each deep trench 201a.

Figure 2E:
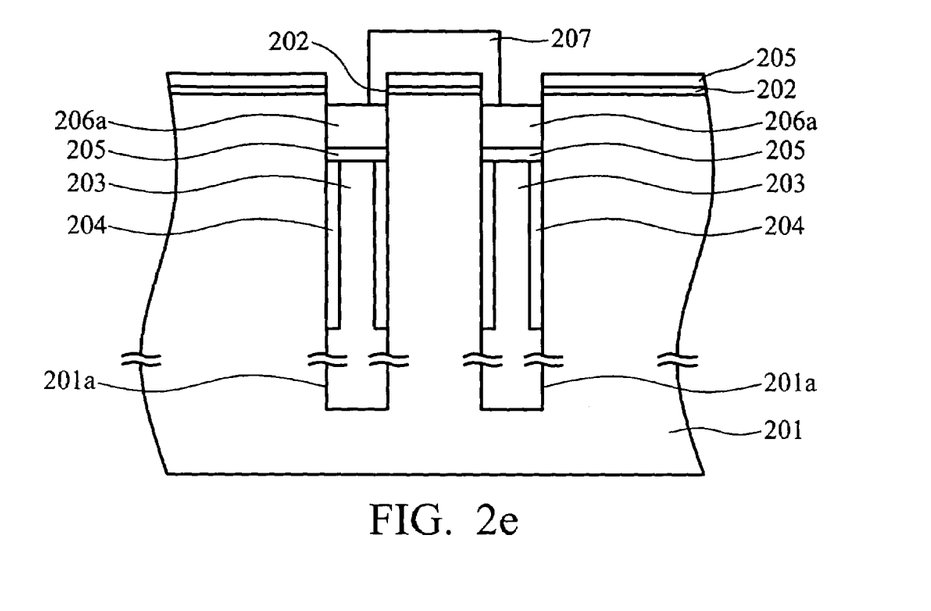

In FIG. 2e, a photoresist layer 207 is formed on the semiconductor substrate 201 between the deep trenches 201a, partially covering the mask layer 206a.

Figure 2F:
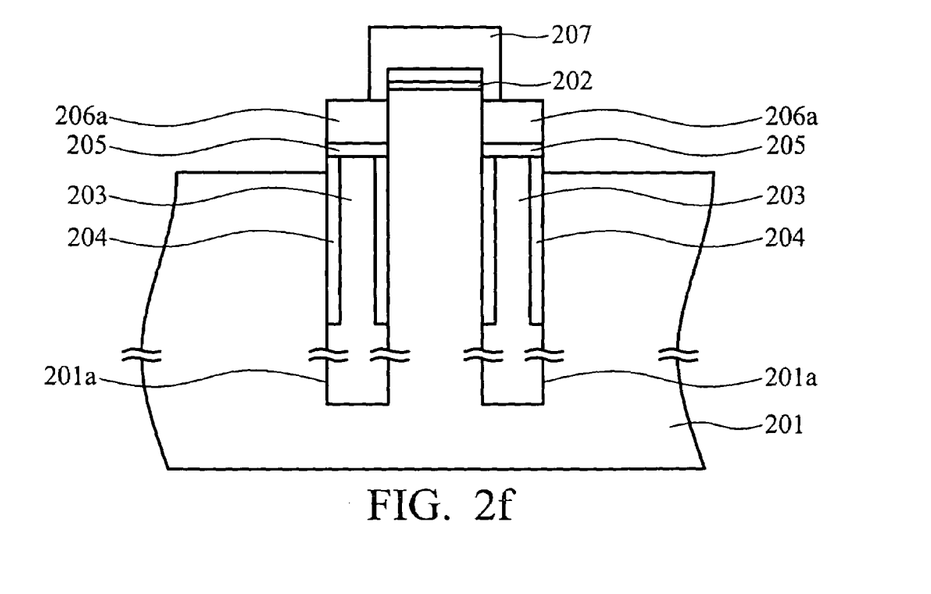

In FIG. 2f, the semiconductor substrate 201 is anisotropically etched by plasma etching or reactive ion etching using the photoresist layer 207 and the mask layer 206a as etching masks until the non-covered semiconductor substrate 201 is lower than the isolating layer 205 by a predetermined depth of about 2600 to 3300 Å. The plasma etching or reactive ion etching is carried out by gas mixture containing HBr and oxygen.

Figure 2G:
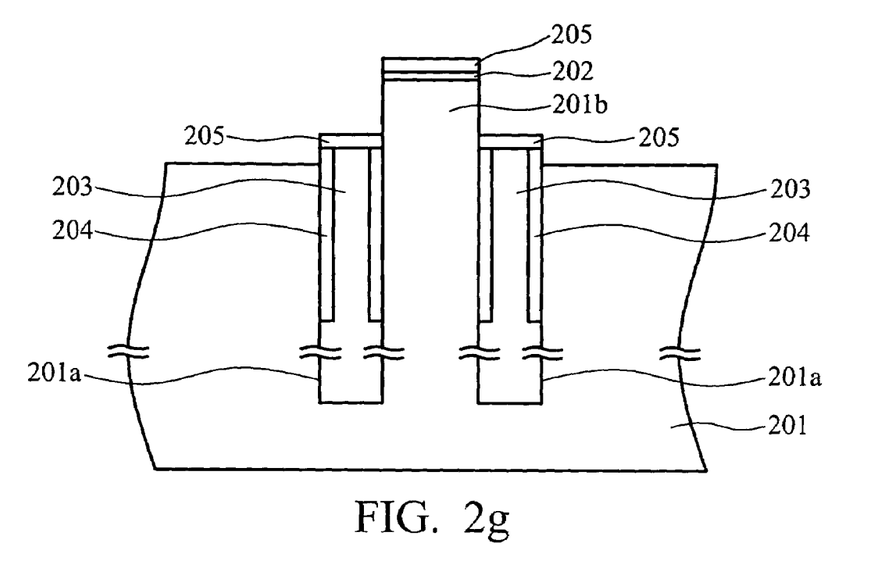

In FIG. 2g, the photoresist layer 207 and the mask layer 206a are removed. The semiconductor substrate 201b between the deep trenches 201a is a pillar.

Figure 2H:
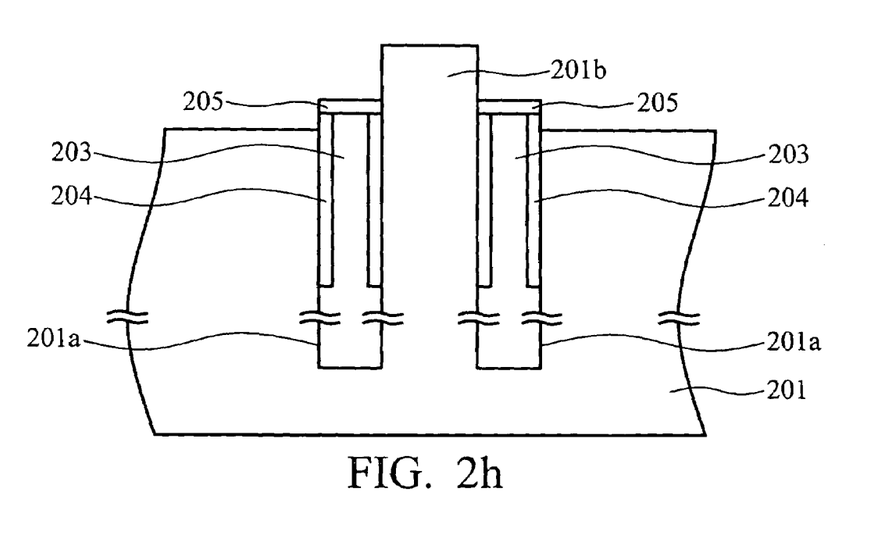

In FIG. 2h, the pad layer is removed. The pillared semiconductor substrate 201b between the deep trenches 201a is the active area of forming a MOS.

The deep trench self-alignment process for an active area of a partial vertical cell of the present invention provides an ARC layer on the deep trench capacitor acting as a self-alignment mask. The ARC layer protects the collar insulating layer from etching gas such as gas mixture containing HBr.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

The invention claimed is:

1. A deep trench self-alignment process for an active area of a partial vertical cell, comprising:
    providing a semiconductor substrate having two deep trenches;
    forming a deep trench capacitor in each deep trench, lower than the top surface of the semiconductor substrate;
    forming an isolating layer covering each deep trench capacitor;
    forming a mask layer in each deep trench and not covering the semiconductor substrate;
    forming a photoresist layer covering the semiconductor substrate between the deep trenches, wherein the mask layer surface is partially covered by the photoresist layer;
    etching the semiconductor substrate using the photoresist layer and the mask layers as etching masks to below the isolating layer; and
    removing the photoresist layer and the mask layers, wherein the pillared semiconductor substrate between the deep trenches act as an active area.

2. The deep trench self-alignment process for an active area of a partial vertical cell of claim 1, wherein a ring-shaped insulating layer is formed on a top sidewall of each deep trench.

3. The deep trench self-alignment process for an active area of a partial vertical cell of claim 2, wherein the ring-shape insulating layer is a collar oxide layer.

4. The deep trench self-alignment process for an active area of a partial vertical cell of claim 1, wherein the isolating layer is an oxide layer.

5. The deep trench self-alignment process for an active area of a partial vertical cell of claim 1, wherein the mask layer is an anti-reflection coating layer.

6. The deep trench self-alignment process for an active area of a partial vertical cell of claim 1, wherein the etching is carried out using a gas mixture containing HBr and oxygen.

7. The deep trench self-alignment process for an active area of a partial vertical cell of claim 1, wherein the etching is anisotropic.

8. The deep trench self-alignment process for an active area of a partial vertical cell of claim 7, wherein the anisotropic etching is plasma or reactive ion etching.

9. A deep trench self-alignment process for an active area of a partial vertical cell, comprising:
    providing a semiconductor substrate, wherein a pad layer is formed covering the semiconductor substrate;

forming two deep trenches in the semiconductor substrate separated by a distance;

forming a deep trench capacitor in each deep trench, wherein the deep trench capacitors are below the top surface of the semiconductor substrate, and a ring-shaped insulating layer is formed on a top sidewall of each deep trench;

conformally forming an isolating layer covering the semiconductor substrate and the deep trenches;

removing the isolating layer from the sidewall of the deep trench to leave the isolating layer on the deep trench capacitor;

forming a mask layer covering the semiconductor substrate, wherein the deep trench is filled with the mask layer;

planarizing the mask layer until the semiconductor substrate is exposed to leave the mask layer in the deep trenches;

forming a photoresist layer covering the semiconductor substrate between the deep trenches, wherein the mask layer is partially covered by the photoresist layer;

etching the semiconductor substrate to a depth using the photoresist layer and the mask layer as etching masks; and removing the photoresist layer and the mask layer, wherein a pillared semiconductor substrate between the deep trenches act as an active area.

10. The deep trench self-alignment process for an active area of a partial vertical cell of claim 9, wherein the pad layer is a pad oxide layer or a pad nitride layer.

11. The deep trench self-alignment process for an active area of a partial vertical cell of claim 9, wherein the distance between the deep trenches is about 1200 to 1400 Å.

12. The deep trench self-alignment process for an active area of a partial vertical cell of claim 9, wherein the ring-shape insulating layer is a collar oxide layer.

13. The deep trench self-alignment process for an active area of a partial vertical cell of claim 9, wherein the isolating layer is an oxide layer.

14. The deep trench self-alignment process for an active area of a partial vertical cell of claim 9, wherein removal uses anisotropic etching.

15. The deep trench self-alignment process for an active area of a partial vertical cell of claim 9, wherein the mask layer is an anti-reflection coating layer.

16. The deep trench self-alignment process for an active area of a partial vertical cell of claim 9, wherein planarization uses chemical mechanical polishing or etching.

17. The deed trench self-alignment process for an active area of a partial vertical cell of claim 9, wherein the etching is carried out using a gas mixture containing HBr and oxygen.

18. The deed trench self-alignment process for an active area of a partial vertical cell of claim 9, wherein the etching is anisotropic.

19. The deed trench self-alignment process for an active area of a partial vertical cell of claim 18, wherein the anisotropic etching is plasma etching or reactive ion etching.

20. The deep trench self-alignment process for an active area of a partial vertical cell of claim 9, where the depth is about 2600 to 3000 Å.

* * * * *